United States Patent
Weimer et al.

(10) Patent No.: US 6,291,868 B1
(45) Date of Patent: *Sep. 18, 2001

(54) FORMING A CONDUCTIVE STRUCTURE IN A SEMICONDUCTOR DEVICE

(75) Inventors: Ronald A. Weimer; Yongjun Jeff Hu; Pai Hung Pan; Deepa Ratakonda, all of Boise; James Beck, Meridian, all of ID (US); Randhir P. S. Thakur, Capertino, CA (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,407

(22) Filed: Feb. 26, 1998

(51) Int. Cl.⁷ .................................................. H01L 29/76
(52) U.S. Cl. ........................................... 257/413; 257/751
(58) Field of Search .................................. 257/412, 751, 257/413

(56) References Cited

U.S. PATENT DOCUMENTS

| | | | |
|---|---|---|---|
| 5,341,016 | * 8/1994 | Prall et al. | 257/412 |
| 5,492,597 | 2/1996 | Keller | 156/643.1 |
| 5,498,562 | 3/1996 | Dennison et al. | 437/52 |
| 5,597,756 | 1/1997 | Fazan et al. | 437/52 |
| 5,796,166 | * 8/1998 | Agnello et al. | 257/369 |
| 5,818,092 | * 10/1998 | Bai et al. | 257/388 |
| 5,852,319 | * 12/1998 | Kim et al. | 257/413 |
| 5,939,758 | * 8/1999 | Arima | 257/413 |
| 5,952,701 | * 9/1999 | Bulucea et al. | 257/407 |
| 5,962,904 | * 10/1999 | Hu | 257/412 |
| 6,087,700 | * 7/2000 | Fazan et al. | 257/413 |
| 6,147,388 | * 11/2000 | Ma et al. | 257/412 |

OTHER PUBLICATIONS

R.A. Weimer et al., *RTP: Study of Some Critical Parameters for DRAM*, 5th International Conference on Advanced Thermal Processing of Semiconductors—RTP'97, Sep. 1997, pp. 91–101.

Stanley Wolf & Richard N. Tauber, *Silicon Processing for the VLSI Era*, vol. 1: Process Technology, pp. 384–406 (1986).

Internet Web Page, *Diffusion/RTP Report: Selective Oxidation of Silicon Over Tungsten*, pp. 1–6 (May 1997).

K. Nakajima et al., *Poly–Metal Gate Process—Ultrathin WsiN Barrier Layer Impermeable to Oxidant In–Diffusion During Si Selective Oxidation*, Conference Proceedings ULSI XI, pp. 317–323 (1996).

* cited by examiner

Primary Examiner—Mark V. Prenty
(74) Attorney, Agent, or Firm—Trop, Pruner & Hu, P.C.

(57) ABSTRACT

A conductive structure for use in a semiconductor device includes a multilayer structure. A first layer includes a material containing silicon, e.g., polysilicon and silicon germanide. A barrier layer is formed over the first layer, with the barrier layer including metal silicide or metal silicide nitride. A top conductive layer is formed over the barrier layer. The top conductive layer can include metal or metal silicide. Selective oxidation can be performed to reduce the amount of oxidation of selected materials in a structure containing multiple layers, such as the multi-layer conductive structure. The selective oxidation is performed in a single-wafer rapid thermal processing system, in which a selected ambient, including hydrogen, is used to ensure low oxidation of a selected material, such as tungsten or a metal nitride.

15 Claims, 6 Drawing Sheets

FORMING A CONDUCTIVE STRUCTURE IN A SEMICONDUCTOR DEVICE

BACKGROUND

The invention relates to forming a conductive structure in a semiconductor device.

Advanced integrated circuits in a semiconductor device require high speed interconnecting lines between circuits for improved device speed. Interconnecting lines are typically made of metal, e.g., aluminum, titanium. However, in some parts of a semiconductor device, particularly in regions where components are densely packed (such as the array of a memory device), or in regions where further heat steps are needed after formation of the interconnecting line during the manufacturing process, other materials are also widely used to form interconnecting lines, e.g., doped polysilicon or N+ or P+ diffused regions The different types of interconnecting lines exhibit different resistivities, with metal generally having the lowest resistivity. Polysilicon, which is also typically used as the conductive electrode at the gate of an N-channel or P-channel metal-oxide-silicon field effect transistor (MOSFET), exhibits a higher resistivity than metal.

As the speed requirements of semiconductors increase, the resistance of interconnecting lines, especially those formed of a higher resistivity material (such as polysilicon) reduces switching speeds of circuits in the device. The resistance of a line increases proportionately with its length. Thus, a polysilicon line running over a long length and connected to a large capacitive load, such as a wordline in a memory array connected to multiple transistors in the array, would cause a high RC delay during circuit switching.

One approach to reduce the resistivity of a polysilicon interconnect line is to use a polycide structure, in which a low resistance silicide (e.g., WSix) is formed on top of a doped polysilicon layer. This effectively forms a two-layer interconnect line in which the silicide layer provides a low resistivity conductive path.

Three-layer interconnecting lines have also been proposed, including a polymetal composite structure having tungsten (W) as the top layer, tungsten silicide nitride (WSiN) as the intermediate layer, and polysilicon as the bottom layer. The polymetal structure has a resistivity lower than the polycide structure that includes tungsten silicide on polysilicon.

SUMMARY

The invention in one aspect is directed to multilayer conductive structures formed of preselected low resistivity materials in a semiconductor device.

This aspect of the invention has one or more of the following advantages. By using certain preselected materials to form the conductive structures, oxidation, agglomeration, and silicidation of layers in the conductive structure can be reduced. By reducing the resistance of conductive structures, the switching speed of circuits in an integrated circuit device can be improved.

In another aspect, the invention is directed to an improved oxidation process that selectively oxidizes certain surfaces while the oxidation of other surfaces is reduced.

This aspect of the invention has one or more of the following advantages. By performing selective oxidation, the oxidation of preselected materials can be reduced to reduce the likelihood of defects in these materials as well as reduce the total number and complexity of subsequent process steps. By using a single-wafer system to perform the selective oxidation, better temperature control, ambient control, and uniformity of oxidation over the entire processed surface of a wafer can be achieved. This is particularly advantageous when large wafers are used.

In general, in one aspect, the invention features a multilayer conductive structure for use in a semiconductor device that includes a first electrically conductive layer formed on a support surface and an electrically conductive barrier layer formed over the first layer. Additionally, the second electrically conductive layer is formed over the barrier layer, the second electrically conductive layer including metal silicide.

In general, in another aspect, the invention features an oxidation system for oxidizing layers formed on a base of a semiconductor device, a first layer containing silicon. The oxidation system includes a source of $H_2$ vapor, a source of $H_2O$ vapor, a flow controller connected to deliver a mixture of $H_2O$ and $H_2$, and a process chamber in which the semiconductor device is placed. The process chamber is connected to receive the mixture of $H_2O$ and $H_2$ to perform selective oxidation of the first layer over the other layers.

Other features and advantages will become apparent from the following description and from the claims.

DETAILED DESCRIPTION

Figure 1:
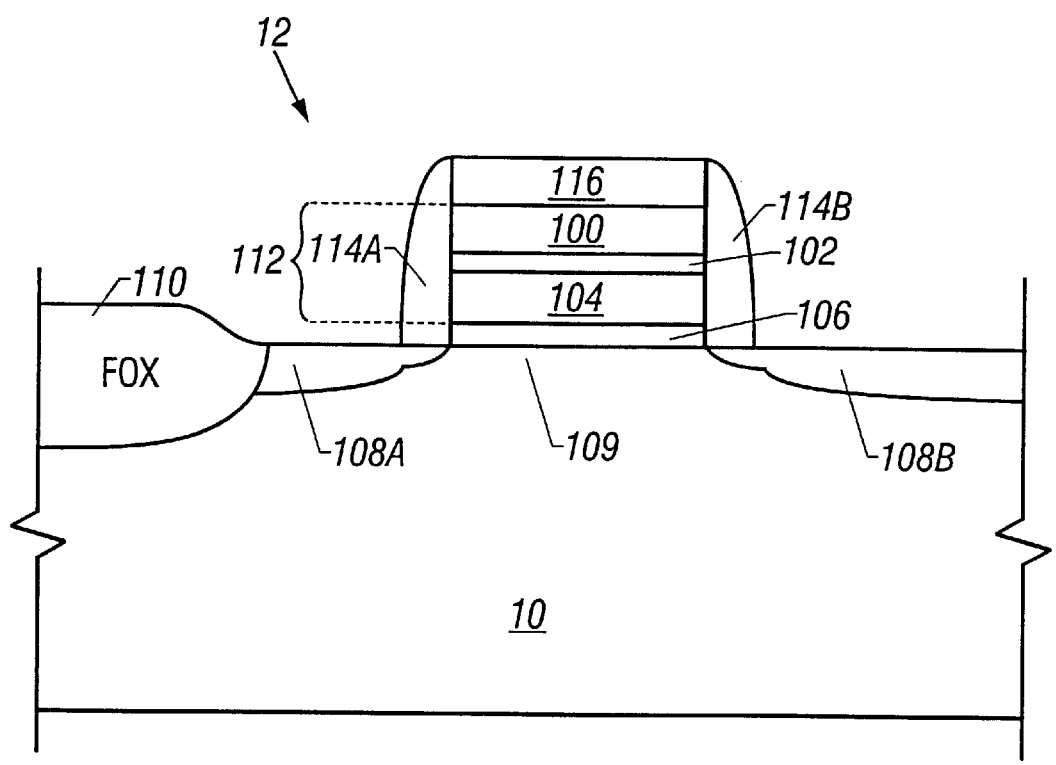
FIG. 1 is an enlarged, cross-sectional view of a transistor in a semiconductor device.

Referring to FIG. 1, a multilayer, low resistivity conductive structure is described. The conductive structure can be used as part of the gate structure of a MOS transistor (as shown) or as an interconnecting line to connect circuits, such as a wordline used to connect transistors connected to memory cells in a memory array.

In FIG. 1, a transistor 12 is formed on a base 10, which includes a semiconductor (e.g., silicon) substrate or multilayer substrate (e.g., silicon-on-insulator or SOI substrate). The transistor 12 is adjacent a field oxide layer 110. The transistor includes source and drain regions 108A and 108B and a channel region 109. If the transistor 12 is used in a memory array, the source would be connected to a memory cell capacitor structure (not shown), while the drain would be connected to a digit line (not shown). The transistor 12 can also have many other uses in a semiconductor device.

A gate oxide layer 106 is formed above the channel region 109. A gate stack 112 is then formed over the gate oxide layer 106. In one embodiment, the gate structure 112 includes three electrically conductive layers (100, 102, 104) to reduce the resistivity of the gate. The three-layer structure can also be used to form an interconnecting line separate from the transistor 12, in which case the gate oxide layer 106 beneath the stack 112 would be replaced with other insulating layers.

The bottom conductive layer 104 is formed of a material that includes silicon, e.g., doped or undoped polysilicon, silicon germanium (SiGex), or amorphous silicon. The top conductive layer 100 includes a low resistivity material, which can be metal or metal silicide. Sandwiched between the top layer 100 and the bottom layer 104 is a conductive diffusion barrier layer 102 that is resistant to oxidation, agglomeration, and silicidation.

The barrier layer 102 acts to prevent agglomeration of silicon from the bottom layer 104 into the top conductive layer 100. For example, titanium silicide (TiSix) formed on polysilicon may result in agglomeration of silicon into the TiSix grains, which can increase resistivity. Silicidation can also occur between certain top layer and bottom layer materials, such as tungsten (W) formed on polysilicon, in which formation of higher resistivity Wsix can occur.

The barrier layer 102 is formed of a material that includes metal silicide, metal nitride, or metal silicide nitride, such as tungsten silicide (Wsix), tungsten silicide nitride (WSixNy), titanium silicide nitride (TiSixNy), tantalum silicide (TaSix), tantalum silicide nitride (TaSixNy), molybdenum silicide (MoSix), and molybdenum silicide nitride (MoSixNy), hafnium silicide (HfSix), hafnium silicide nitride (HfSixNy), zirconium silicide nitride (ZrSixNy), niobium silicide (NbSix), niobium silicide nitride (NbSixNy), and titanium nitride (TiNy).

Generally, a silicide, nitride, or silicide nitride composition is resistant to oxidation and is stable at high temperatures. The ability to withstand high temperatures is particularly important since the gate structure or interconnecting line is put through various subsequent high temperature process steps, including source-drain implant anneal, oxidation, and glass flow/reflow.

Metal silicides, nitrides, or silicide nitrides also have other desirable properties, including low resistivity, ease of formation, controlled oxidation properties, and stability in an oxidizing ambient. These materials also have excellent adhesion characteristics and exhibit low stress contacts.

The resistivity of a metal silicide, metal nitride, or metal silicide nitride barrier layer 102 is dependent on several factors, including the method of formation, annealing times and temperatures, and chemical purity. The stoichiometry of the refractory metal silicide, metal nitride, or metal silicide nitride composition can also affect resistivity; e.g., the x value of an MSix composition and the x and y values of an MSixNy composition can affect the resistivity.

In the barrier layer 102 containing an MSixNy composition, the value of x for silicon can be set at a value greater than 2, while the value of y for nitrogen is set in the range between about 0.1 and 0.9, preferably between about 0.5–0.6. With higher y values, the MSixNy compositions are more stable at higher temperatures, but the compositions also have higher resistivities.

The top conductive layer 100 can be made from low resistivity materials, e.g., metal or metal silicides, such as tungsten (W), cobalt (Co), titanium silicide (TiSix), cobalt silicide (CoSix), nickel silicide (NiSix), or other metal or metal silicide layers. Typically, the value of x may be greater than or equal to 2, with the exception of NiSix, where x can be equal to one. Generally, the metal silicide compositions are more stable at high temperatures than tungsten or cobalt, which tend to have relatively high oxidation rates.

The gate stack 112 and the gate oxide 106 are electrically insulated by side insulating spacers 114A and 114B and a top insulating layer 116. The insulating materials can be formed using silicon nitride ($Si_3N_4$) or silicon dioxide ($SiO_2$).

Figure 2:
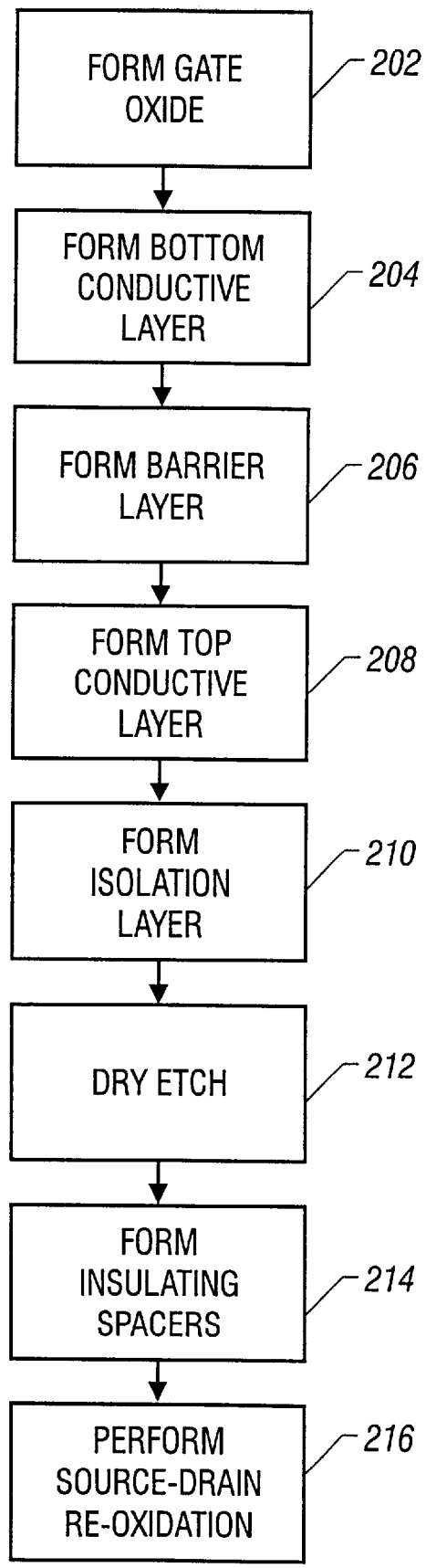
FIG. 2 is a flow diagram of the fabrication steps for forming portions of the transistor structure of FIG. 1.

Referring to FIG. 2, the fabrication flow of portions of the transistor 12 shown in FIG. 1 is illustrated. After the field oxide 110 and source-drain regions 108A and 108B are formed in the base 10, the gate oxide 106 is formed on the surface of the base 10 (step 202) by thermal growth or deposition such as chemical vapor deposition (CVD). The thickness of the gate oxide 106, for current generation technologies, can typically range from about 30 angstroms (Å) to 150 Å.

Next, the bottom conductive layer 104 (which can include polysilicon, SiGex, or amorphous silicon) is formed, such as by deposition using a low pressure chemical vapor deposition (LPCVD) process. The bottom conductive layer 104 can have an exemplary thickness ranging from about 100 Å to 3,000 Å. The polysilicon, SiGex, or amorphous silicon layer 104 can also be doped with a dopant such as phosphorous or boron to improve electrical conductivity.

Next, the barrier layer 102 is formed (step 206) to a thickness between about 50 Å to 500 Å, for example. Various methods can be used to form the diffusion barrier layer 102, including using chemical vapor deposition (CVD), physical vapor deposition (PVD), or deposition followed by a high temperature anneal of a metal (e.g., tungsten or titanium) in an ambient containing nitrogen, ammonia ($NH_3$), or hydrazine ($N_2H_4$) in a rapid thermal processing (RTP) system.

Formation of metal silicide barrier layers using CVD may involve deposition of the metal onto the bottom conductive layer 104 followed by subsequent heating, which causes the metal and silicon containing material in the layer 104 to react to form a silicide. This type of silicide formation can yield low resistivity silicide layers.

To form a barrier layer 102 having metal silicide nitride (MSixNy) or metal nitride (MNy), the metal deposition onto the bottom conductive layer step is followed by a high temperature (e.g., 600–1000° C.) anneal in an ambient including $NH_3$ or $N_2H_4$. The $NH_3$ or $N_2H_4$ anneal can be performed in a rapid thermal processing (RTP) system for a predetermined amount of time, e.g., between about 1–60 seconds. If the metal deposited is tungsten on a polysilicon, SiGex, or amorphous silicon layer, the anneal step forms a barrier layer that contains Wsix and SiN, with no formation (or very little formation) of tungsten nitride (WN), as illustrated by the X-ray photoelectron spectrometer (XPS) profile graph shown in FIG. 6. Wsix and SiN are more oxidation resistant than WN or tungsten. The high temperature anneal can also be performed with a titanium on a silicon-containing material structure. The anneal in the $NH_3$ or $N_2H_4$ ambient forms a TiNy barrier layer.

Figure 6:
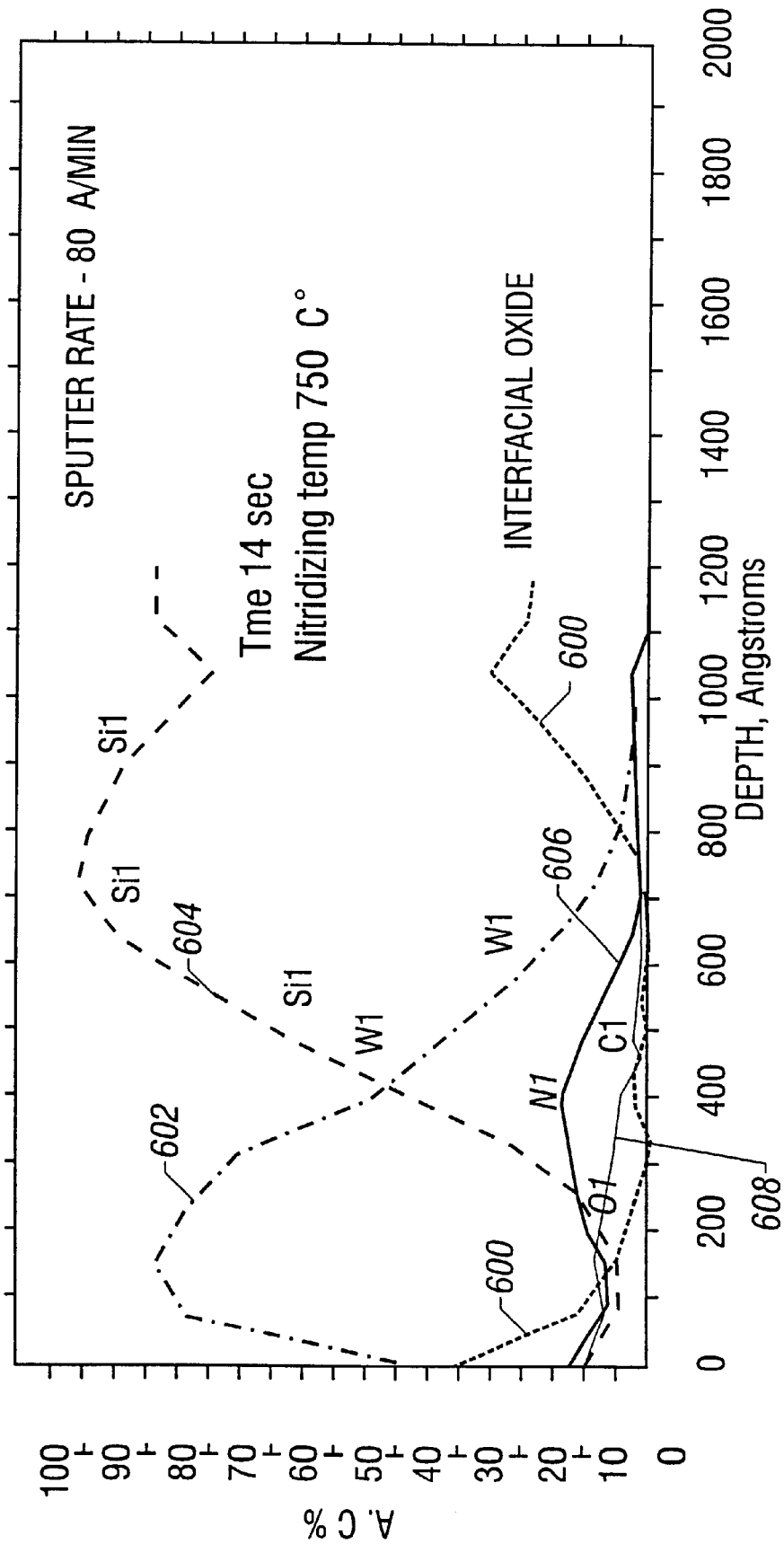
FIG. 6 is graph of an X-ray photoelectron spectrometer (XPS) surface analysis showing the selective oxidation region for a multilayer conductive structure.

FIG. 6 shows the percentage of materials present in a Wsix-polysilicon stack after anneal of a W/poly-Si structure in an $NH_3$ ambient at 750° C. The depth (as defined by an axis generally projecting perpendicularly from the surface of the base 10) begins at the top surface (0 Å) of the stack 112 (without the top conductive layer 100) and continues downwardly into the stack. A layer of tungsten is initially deposited on polysilicon. After anneal in the $NH_3$, the layers formed include a tungsten layer 100 at the top and a Wsixny barrier layer 102 between the top tungsten layer and the bottom conductive layer 104.

PVD by sputtering or evaporation can also be used to form metal silicides and metal silicide nitrides. The evaporation method utilizes simultaneous deposition of the metal and silicon (or metal, silicon and nitrogen) under high vacuum or sputtering of a metal silicide composite target. Sputtering of the metal and silicon (or metal, Si, and N) can be performed using RF or magnetron sputtering.

After formation of the barrier layer 102, the metal or metal silicide conductive layer 100 is formed over the barrier layer 102 (step 208), using either CVD or PVD techniques, for example. The conductive layer 100 can be formed to a thickness between about 200 Å to 2000 Å. Following formation of the top conductive layer 100, the electrically insulating cap layer 116 is formed over the conductive layer 100 as an etch stop and oxidation barrier (step 210). The insulating layer 116 can be formed using vapor deposited $SiO_2$ or $Si_3N_4$. A dry etch process (such as reactive ion etching) is then used to form the gate stack (step 212).

After the gate stack is formed, nitride insulating spacers 114A and 114B can optionally be formed using known methods, such as by LPCVD or PECVD nitride (step 214). Oxide spacers can also be used, such as those formed using CVD with tetraethylorthosilicate (TEOS). Whether this step is performed depends on the type of materials used in forming the stack 112.

For example, if a stack having a tungsten conductor on a titanium nitride barrier is used, then the spacers are useful as etch barriers as well as oxidation barriers in subsequent processing steps. The spacers 116A and 116B may also be used with other stacks that contain a metal conductor on a metal silicide or nitride barrier.

The spacer forming step 214 may not be needed when a stack having a metal silicide conductor on a metal silicide or metal silicide nitride barrier (e.g., TiSix conductor on Wsix barrier) is used. With such stacks, the spacer formation is performed after the source-drain re-oxidation step (216).

The source-drain re-oxidation step (216) is performed to remove damage caused by reactive ion etching and patterning of the gate electrode. The re-oxidation step causes oxide to be thermally grown on the sidewall of the etched polysilicon, SiGex, or amorphous silicon electrode, which also serves to thicken the gate oxide 106 at the gate edge to improve the gate oxide dielectric strength. The source-drain re-oxidation can be performed in the following environment: $O_2$; $O_2/H_2$; $N_2O$; NO; or a selective ambient, such as an $H_2O/H_2$ ambient in which the ratio of $H_2O$ to $H_2$ is controlled to predetermined ranges.

If the top conductive layer 100 is formed of a metal silicide material, and the barrier layer 102 is formed of a metal silicide or metal silicide nitride material, then the two layers are relatively resistant to oxidation and any of the source-drain re-oxidation techniques listed above can be used. However, certain materials that can be used in the top conduction layer 100, such as tungsten (W) or titanium (Ti), and certain materials in the barrier layer 102, such as a metal nitride (e.g., TiN), have relatively high oxidation rates.

For example, tungsten oxidation rate is much faster than that of silicon, and typical oxidation processes can cause the volume of tungsten oxide ($WO_3$) to be much larger than that of W. If $WO_3$ formation occurs, peeling or morphological degradation of the tungsten film may occur. Thus, in cases where the top conduction layer 100 has a relatively high oxidation rate, a selective oxidation process is preferred over conventional oxidation or wet oxidation. Similar issues exist when titanium is used as the top conduction layer 100.

Possible metal nitride materials (in addition to the materials discussed above) for the barrier layer 102 include tungsten nitride (WN) or titanium nitride (TiN), which are susceptible to relatively fast oxidation. If such barrier layers are used, then selective oxidation may be particularly advantageous. However, even if metal silicide top conductive layers 100 or metal silicide or metal silicide nitride barrier layers 102 are used, the selective oxidation process may also help to reduce the rate of oxidation of those materials.

Figure 3:
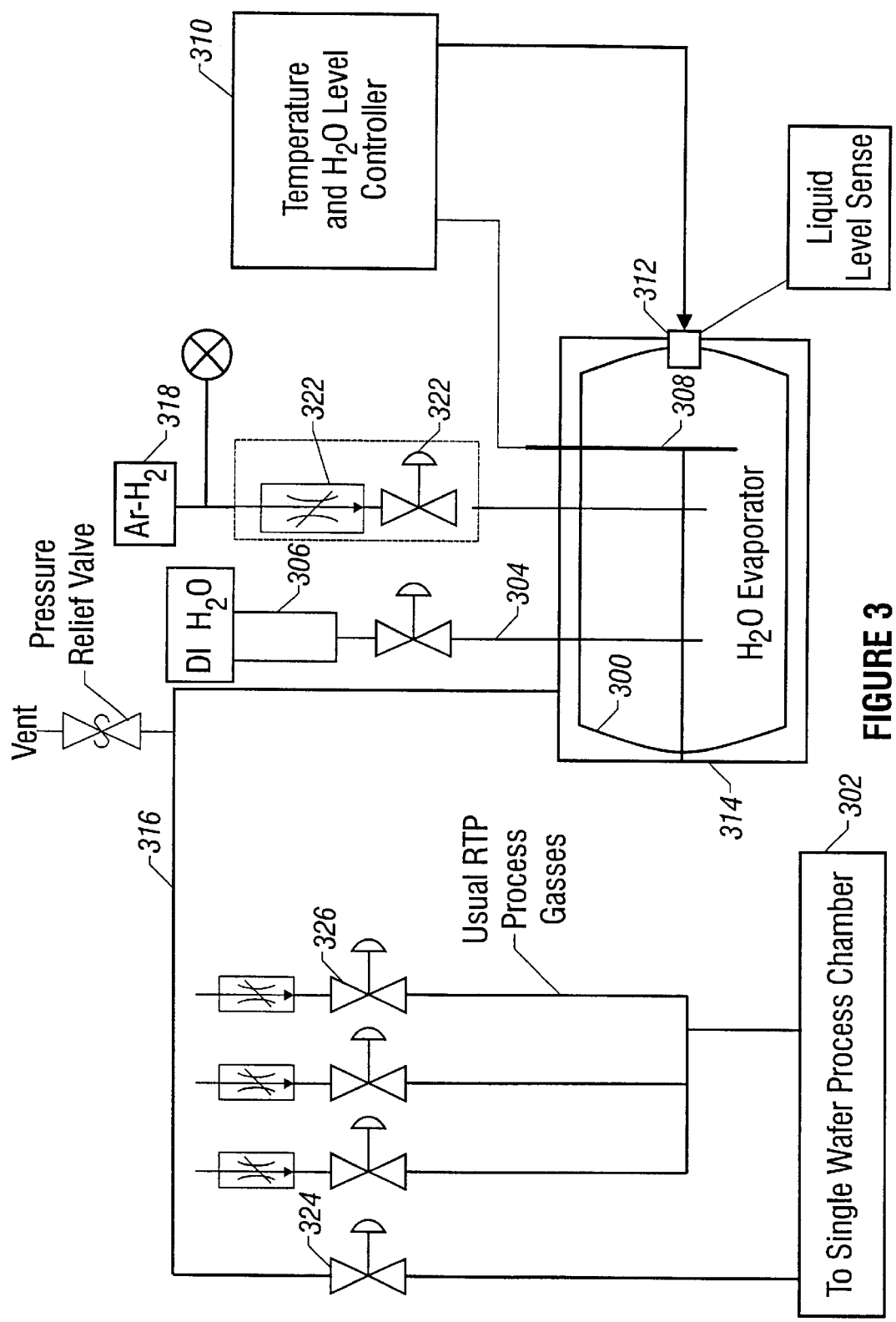
FIGS. 3, 4, and 5 are block diagrams of single-wafer rapid thermal processing systems for performing selective oxidation.
Figure 4:
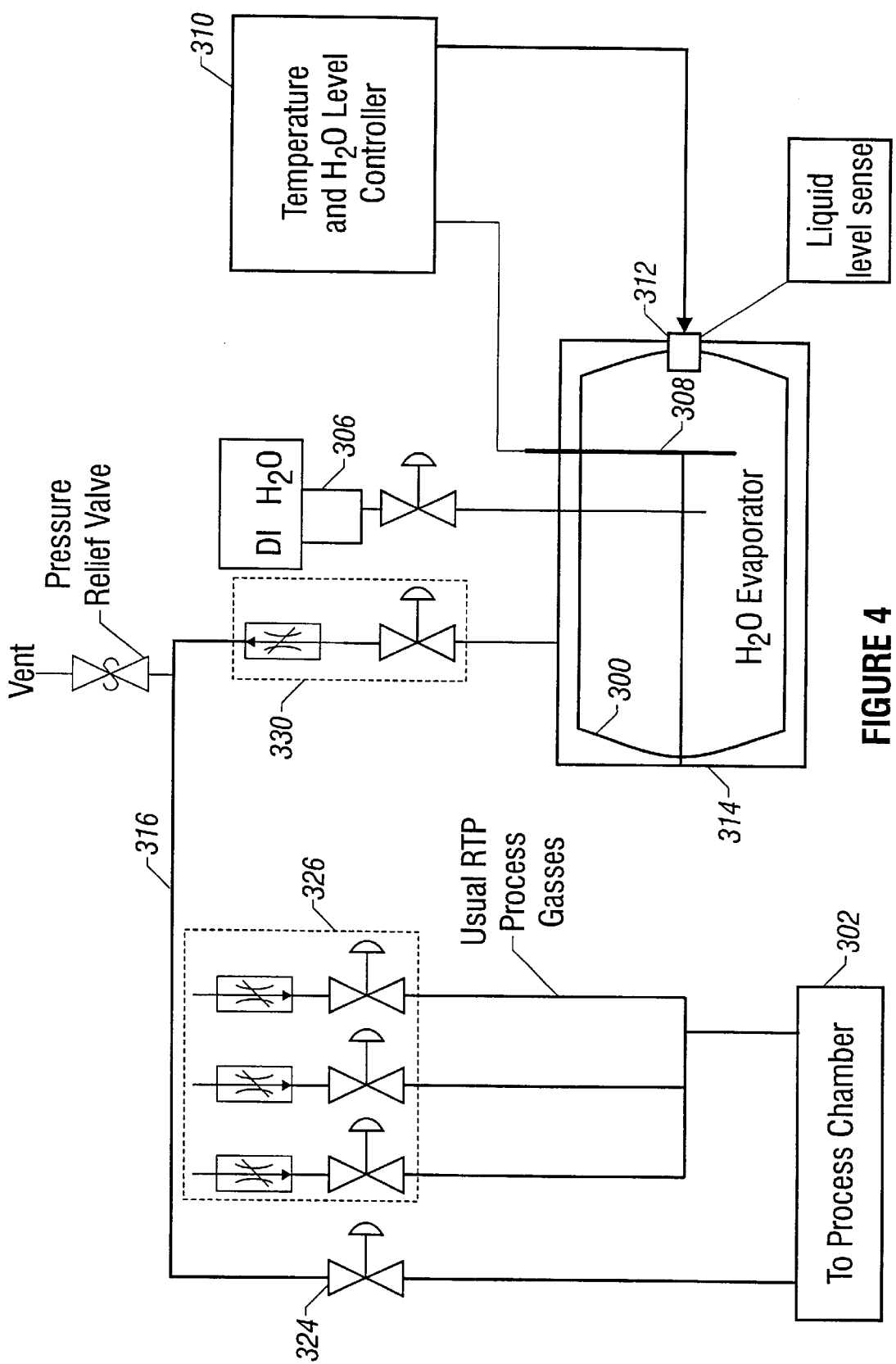
Figure 5:
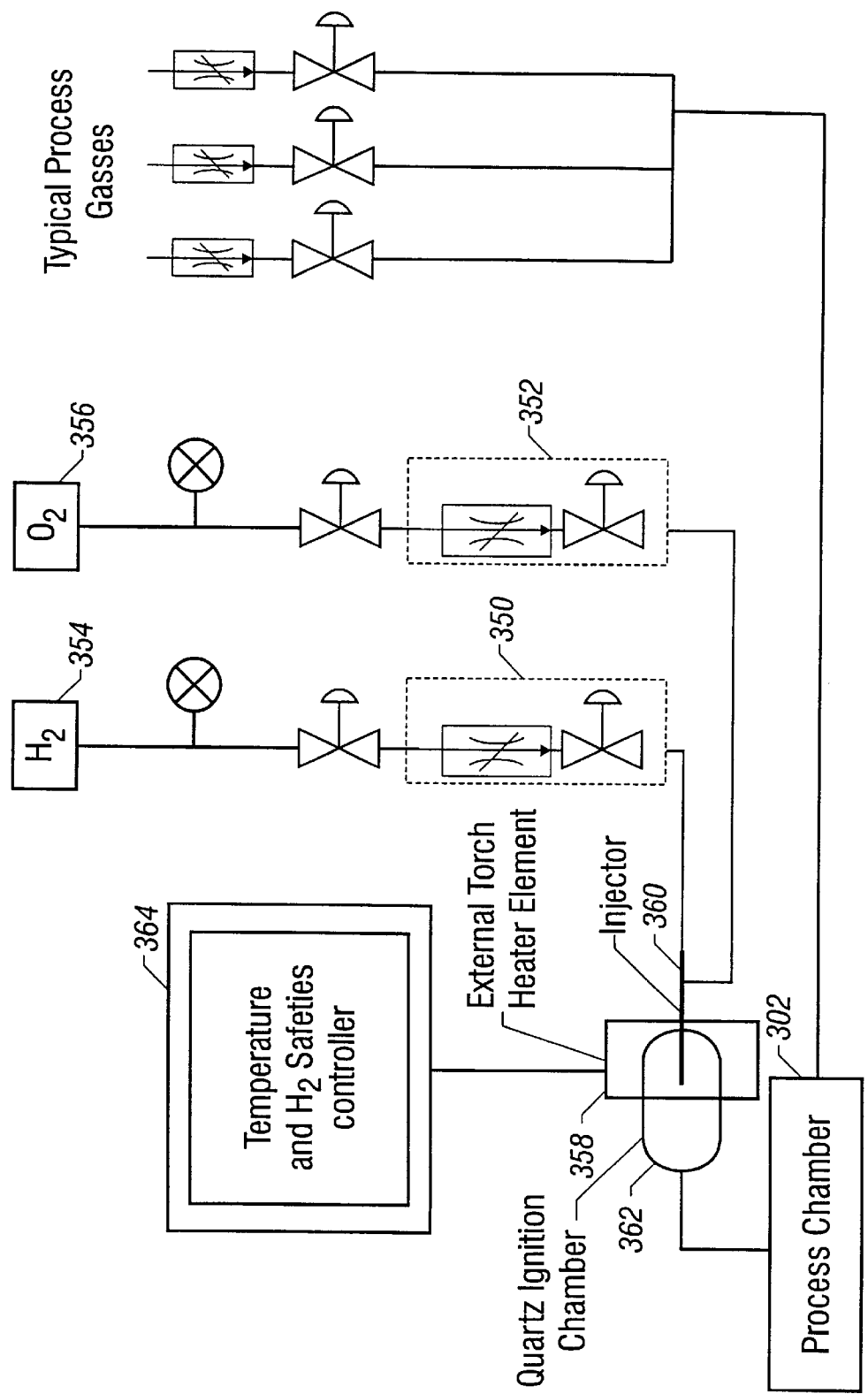

Selective source drain re-oxidation can be performed in a water vapor ambient with controlled amounts of hydrogen added in a single-wafer rapid thermal processing (RTP) system (e.g., an AG8108 Heat Pulse RTP system) for selective oxidation of silicon over the metal, metal silicide, metal silicide nitride, or metal nitride top conducting layer 100 or barrier layer 102. In addition, use of a single-wafer system, such as the three types shown in FIGS. 3–5, provide several advantages over use of a furnace that can receive multiple wafers. In a single-wafer RTP system, better control of process conditions can be achieved. For example, better uniformity of temperature can be achieved over the entire surface of the wafer, which is particularly advantageous when large wafers (e.g., 300 mm wafers) are used. In addition, better ambient control and uniformity of oxidation over the entire processed surface of a wafer can be achieved.

The described selective oxidation processes (shown in FIGS. 3, 4, and 5) can also be applied to multi-wafer furnace systems.

Referring to FIG. 3, an RTP single-wafer system uses an ambient of argon-hydrogen ($Ar-H_2$) and water vapor. Other inert gases besides Ar can also be used. By controlling the ratio of $H_2O$ to $O_2$, use of this ambient can reduce oxidation of a metal (e.g., tungsten) top conductive layer 100 and WN, Wsixny, TiN, and other metal nitride conductive diffusion barrier layers 102.

A quartz vessel 300 (which can contain 20 liters of liquid) is filled approximately half full of deionized water through a liquid flow controller 304 from a source 306. The vessel 300 is then heated and maintained at an elevated temperature, e.g., between about 95–98° C., through use of an external heating blanket 314 affixed to the outside of the quartz vessel 300. The elevated temperature evaporates portions of the deionized water.

The temperature of the deionized water in the vessel 300 is monitored by a thermocouple 308 inserted into a sheath in the quartz vessel 300. The over temperature trip level of the thermocouple 308 can be set at about 120° C. The thermocouple 308 is connected to a temperature and water level controller 310 for monitoring. The controller 310 adjusts the temperature of the blanket 314 as the liquid temperature in the vessel 300 varies. Over temperature thermocouples (not shown) can also monitor the heater blanket 314 temperature to prevent heater blanket temperature runaway.

The level of the deionized water in the vessel 300 is monitored by a liquid level sensor 312, also connected to the controller 310. The controller 310 adjusts the flow rate through the flow controller 304 to maintain the level of the liquid in the vessel 300. The autofill feature for the deionized water is disabled during a process run (to perform the source drain re-oxidation) so as not to disturb the water vapor delivery.

Delivery of the deionized water vapor is achieved by injecting an $Ar-H_2$ mixture into the vessel 300 through a mass flow controller 322 at a predetermined rate. The $Ar-H_2$ comes from a source 318. The $H_2$ can originate from a pure hydrogen source or from a breakdown of a hydrogen containing compound such as $NH_3$ or $N_2H_4$. The resulting water and argon vapor is transported through a line 316 (which can be a ½ inch heat taped stainless steel line) maintained at a predetermined temperature, e.g., about 110° C., to prevent recondensation of the vapor.

The vapor in the line 316 flows through a vapor flow controller 324 to a single-wafer process chamber 302. Other conventional RTP process gases are also provided through flow controllers 326 to the processor chamber 302. The flow of $H_2O$ can be selected to be in the range between about 1 SCCM (standard cubic centimeters per minute) and 50 SLM (standard liters per minute), with a preferred range of about 1 SCCM to 10 SLM. The flow rate of $H_2$ can be selected to a value in the range between about 1 SCCM and 50 SLM, with a preferred range of about 1 SCCM to 20 SLM. In the AG8108 system, the $H_2O/H_2$ partial pressure ratio can be maintained between about 2.3 and 2.8. However, the ratios vary according to the specific types of RTP systems used. The processing temperature in the single-wafer processing chamber can be maintained between about 950° C. and 1100° C. Selective oxidation of silicon over tungsten of about 2:1 can be achieved using the system of FIG. 3.

Referring to FIG. 4, an alternative single-wafer RTP system performs source-drain selective re-oxidation using a different transport system. Elements that are the same as in the RTP system of FIG. 1 have common reference numerals. As in the RTP system of FIG. 1, a predetermined amount of deionized water is kept in the vessel 300 (e.g., half full in a 20-liter vessel). However, delivery of the deionized water vapor is achieved through the use of a vapor flow controller 330, rather than through use of the mass flow controller 322 to pump argon 318 into the vessel 300 to move vapor through the line 316. The pressure in the water vessel 300 can be approximately 960 Torr, which is sufficient to generate ample flow through the vapor flow controller 330. The vapor is then transported through the line 316 to the process chamber 302, with the line temperature maintained at about 110° C. to prevent recondensation of the vapor. Hydrogen is passed through one of the vapor flow controllers 326 to the process chamber 302 to perform selective oxidation of silicon over other materials.

Referring to FIG. 5, an RTP system with an external torch assembly is used to create the water vapor flow for selective oxidation. Hydrogen ($H_2$) and oxygen ($O_2$) are delivered through vapor flow controllers 350 and 352, respectively, from sources 354 and 356, respectively. The $H_2$ and $O_2$ are delivered to an injector 360 inserted into the external torch assembly 358. The torch assembly 358 is maintained at a temperature of about 900° C. to provide ignition energy. The resulting water vapor and $H_2$ mixture is delivered to the single-wafer process chamber 302 via a quartz tube interface 362.

As is the case with the RTP system of FIG. 3, the RTP systems of FIGS. 4 and 5 also maintain a predetermined $H_2O/H_2$ partial pressure ratio and temperature.

In the RTP system of FIG. 5, safety measures are provided by an external controller 364, which monitors and maintains the external torch element temperature and provides over temperature and runaway safeties. The controller 364 can also implement steps to ensure safety associated with using $H_2$ as a process gas. The safety mechanisms implemented include maintaining a particular $H_2/O_2$ ratio. Thus, $H_2$ flow is disabled if no $O_2$ is present; $H_2$ is disabled if the torch temperature is below 700° C.; an initial nitrogen ($N_2$) purge is performed of the injector 360 before the flow of $H_2$ is turned on; and $H_2$ leak detectors are used to determine when to turn off and purge the $H_2$ line if an $H_2$ leak is detected. The controller 364 also monitors the temperature of the process chamber 302 to prevent water vapor from being formed if the process chamber 302 is below 700° C. to prevent recondensation of the water vapor.

Other embodiments are also within the scope of the following claims. Although the layers in the multilayer conductive structure have been described with certain thicknesses for each layer, it is contemplated that the layer thicknesses can be varied and still achieve desirable results. The conductive structure described can be formed with a stack having more than three layers. Further, various systems and processes have been described with particular parameters; these parameters can also be varied. The systems described have components associated with certain, specific parameters and values, which can be varied.

What is claimed is:

1. A multilayer conductive structure for use in a semiconductor device, comprising:

a first electrically conductive layer formed on a support surface;

an electrically conductive barrier layer formed over the first layer, the barrier layer including metal silicide nitride, MSixNy, wherein x is greater than about 2 and y ranges between about 0.1 and 0.9; and a second electrically conductive layer formed over the barrier layer, the second electrically conductive layer having a material selected from the group consisting of a metal silicide, MSix, with x greater than or equal to 2; and NiSin, with n being at least one.

2. The conductive structure of claim 1, wherein the first electrically conductive layer includes polysilicon.

3. The conductive structure of claim 1, wherein the first electrically conductive layer includes SiGe.

4. The conductive structure of claim 1, wherein the first electrically conductive layer includes amorphous silicon.

5. The conductive structure of claim 1, wherein the barrier layer is resistant to silicidation.

6. The conductive structure of claim 1, wherein the barrier layer is resistant to agglomeration of silicon.

7. The conductive structure of claim 1, wherein the barrier layer is resistant to oxidation.

8. The conductive structure of claim 1, wherein the first conductive layer, barrier layer, and second conductive layer form the gate structure of a transistor.

9. A semiconductor device, comprising:

a transistor having a gate structure including a first layer having a material selected from the group consisting of polysilicon, SiGe, and amorphous silicon;

a barrier layer formed over the first layer, the barrier layer including metal suicide nitride, MSixNy, wherein x is greater than about 2 and y ranges between 0.1 and 0.9; and a conductor formed over the barrier layer, the conductor including a metal silicide, MSix, with x of at least one.

10. The conductive structure of claim 1, wherein y ranges between about 0.5 and about 0.6.

11. The semiconductor device of claim 9, wherein y ranges between about 0.5 and about 0.6.

12. The semiconductor device of claim 9, wherein the metal silicide includes nickel silicide.

13. The semiconductor device of claim 9, wherein the metal silicide, MSin, has n of greater than or equal to about 2.

14. The semiconductor device of claim 13, wherein the metal silicide includes a member selected from the group consisting of titanium silicide, cobalt silicide and nickel silicide.

15. A transistor comprising:
a gate structure including lower and upper electrically conductive layers and a barrier layer formed between the lower and upper electrically conductive layers,
the barrier layer consisting essentially of a metal silicide selected from the group consisting of tantalum silicide, molybdenum silicide, hafnium silicide, and niobium silicide,
the upper electrically conductive layer including a metal silicide selected from the group consisting of cobalt silicide and nickel silicide,
wherein the upper electrically conductive layer includes $NiSi_n$, where n is at least about one.

* * * * *